US008848420B2

(12) United States Patent
Ahn et al.

(10) Patent No.: US 8,848,420 B2
(45) Date of Patent: Sep. 30, 2014

(54) VARIABLE RESISTANCE MEMORY DEVICE AND DATA STORAGE DEVICE INCLUDING THE SAME

(75) Inventors: Chang Yong Ahn, Icheon-si (KR); Ho Seok Em, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 298 days.

(21) Appl. No.: 13/590,763

(22) Filed: Aug. 21, 2012

(65) Prior Publication Data

US 2013/0322155 A1 Dec. 5, 2013

(30) Foreign Application Priority Data

May 31, 2012 (KR) .......................... 10-2012-0058229

(51) Int. Cl.
G11C 11/00 (2006.01)
(52) U.S. Cl.
USPC ............................ 365/148; 365/158; 365/173
(58) Field of Classification Search
CPC ........... G11C 13/0004; G11C 13/0069; G11C 11/56; G11C 13/0002; G11C 13/0011; G11C 13/0023; G11C 13/0061; G11C 8/08; G11C 11/5628; G11C 16/10; G11C 11/16; G11C 11/15; G11C 11/5607; G11C 13/0038; G11C 13/004; G11C 11/1673; G11C 2013/0071; G11C 2211/5615
USPC .................. 365/148, 158, 163, 171, 173, 201
See application file for complete search history.

(56) References Cited

U.S. PATENT DOCUMENTS

2010/0103726 A1* 4/2010 Bae et al. ...................... 365/163
2011/0299320 A1* 12/2011 Kono ............................ 365/148
2014/0063905 A1* 3/2014 Ahn et al. ..................... 365/148

FOREIGN PATENT DOCUMENTS

KR 100784866 B1 12/2007
KR 1020100013645 A 2/2010

* cited by examiner

Primary Examiner — Hien Nguyen
(74) Attorney, Agent, or Firm — William Park & Associates Patent Ltd.

(57) ABSTRACT

A variable resistance memory device includes memory cells arranged at a region where word lines and bit lines cross each other, control logic configured to generate a command flag indicative of a program operation mode in response to a program command provided from an external device and configured to control the program operation of the memory cells based on the command flag and a write driver configured to be activated in response to the flag command and configured to supply a program current to the memory cells.

20 Claims, 9 Drawing Sheets

FIG.6

| CMD FLAG | Mode | Action |
|---|---|---|
| | Erase | Program data "1" |
| | Single Program | Program only data "0" |
| | Buffer Program | Sequential program only data "0" |
| | Single Overwrite Program | Program data "0" or "1" |
| | Buffer Overwrite Program | Sequential program data "0" or "1" |

US 8,848,420 B2

VARIABLE RESISTANCE MEMORY DEVICE AND DATA STORAGE DEVICE INCLUDING THE SAME

CROSS-REFERENCES TO RELATED APPLICATION

The present application claims priority under 35 U.S.C. §119 (a) to Korean application number 10-2012-0058229, filed on May 31, 2012, in the Korean Intellectual Property Office, which is incorporated herein by reference in its entirety.

BACKGROUND

1. Technical Field

The present invention generally relates to a nonvolatile memory device, and to a variable resistance memory device.

2. Related Art

In general, a semiconductor memory device is classified into a volatile memory device and a nonvolatile memory device. The volatile memory device loses data stored therein when power is cut off, whereas the nonvolatile memory device retains data stored therein even though power is cut off.

The nonvolatile memory device includes various types of memory cells. Depending on the structures of the memory cells, the nonvolatile memory device may be classified into a flash memory device, ferroelectric RAM (FRAM) using a ferroelectric capacitor, magnetic RAM (MRAM) using a tunneling magneto-resistive (TMR) layer, and a phase change memory device using chalcogenide alloys. Particularly, the phase change memory device is a nonvolatile memory device using a phase change, that is, a resistance change, according to a temperature change. For this reason, the phase change memory device is also called a variable resistance memory device.

The memory cell of the phase change memory device is made of a calcogen compound, that is, phase change materials, for example, a germanium (Ge)-antimony (Sb)-tellurium (Te) mixture (GST) (hereinafter referred to as "GST materials"). The GST materials have an amorphous state indicative of relatively high resistivity and a crystalline state having relatively low resistivity. The memory cell of the phase change memory device may store data "1" corresponding to the amorphous state and data "0" corresponding to the crystalline state. When the GST materials are heated, data corresponding to the amorphous state or the crystalline state is programmed into the memory cell of the phase change memory device. For example, the amorphous state or crystalline state of the GST materials may be controlled by controlling the amount of current for heating the GST materials and the time that it takes to supply the current.

The program operation of the variable resistance memory device includes a program operation and a verify read operation for verifying the state of a memory cell. The time that it takes to supply a program current to the memory cell accounts for a large part of the time necessary for the program operation of the variable resistance memory device. That is, if the time that it takes to supply a program current to the memory cell is reduced, the program performance of the variable resistance memory device will be an improved program.

The time that it takes to supply a program current to the memory cell includes the time that it takes to prepare for the program current to be supplied to the memory cell and the time that it takes the state of the memory cell to be changed by the program current. Accordingly, if the time that it takes to prepare for or stabilize the program current to be supplied to the memory cell is reduced, the program performance of the variable resistance memory device may be improved.

SUMMARY

An embodiment generally relates to a variable resistance memory device having a reduced program time and a data storage device including the same.

In an embodiment, a variable resistance memory device includes memory cells arranged at a region where word lines and bit lines cross each other, control logic configured to generate a command flag indicative of a program operation mode in response to a program command provided from an external device and configured to control the program operation of the memory cells based on to the command flag and a write driver configured to be activated in response to the flag command and configured to supply a program current to the memory cells.

In another embodiment, a data storage device includes a variable resistance memory device and a controller configured to control the variable resistance memory device, wherein the variable resistance memory device includes memory cells arranged at a region where word lines and bit lines cross each other, control logic configured to generate a command flag indicative of a program operation mode in response to a program command provided from the controller and configured to control the program operation of the memory cells based on the command flag, and a write driver configured to be activated in response to the flag command and configured to supply a program current to the memory cells.

BRIEF DESCRIPTION OF THE DRAWINGS

Features, aspects, and embodiments are described in conjunction with the attached drawings, in which:

FIG. 6 is a table illustrating an example of command flag according to an embodiment;

DETAILED DESCRIPTION

Figure 1:
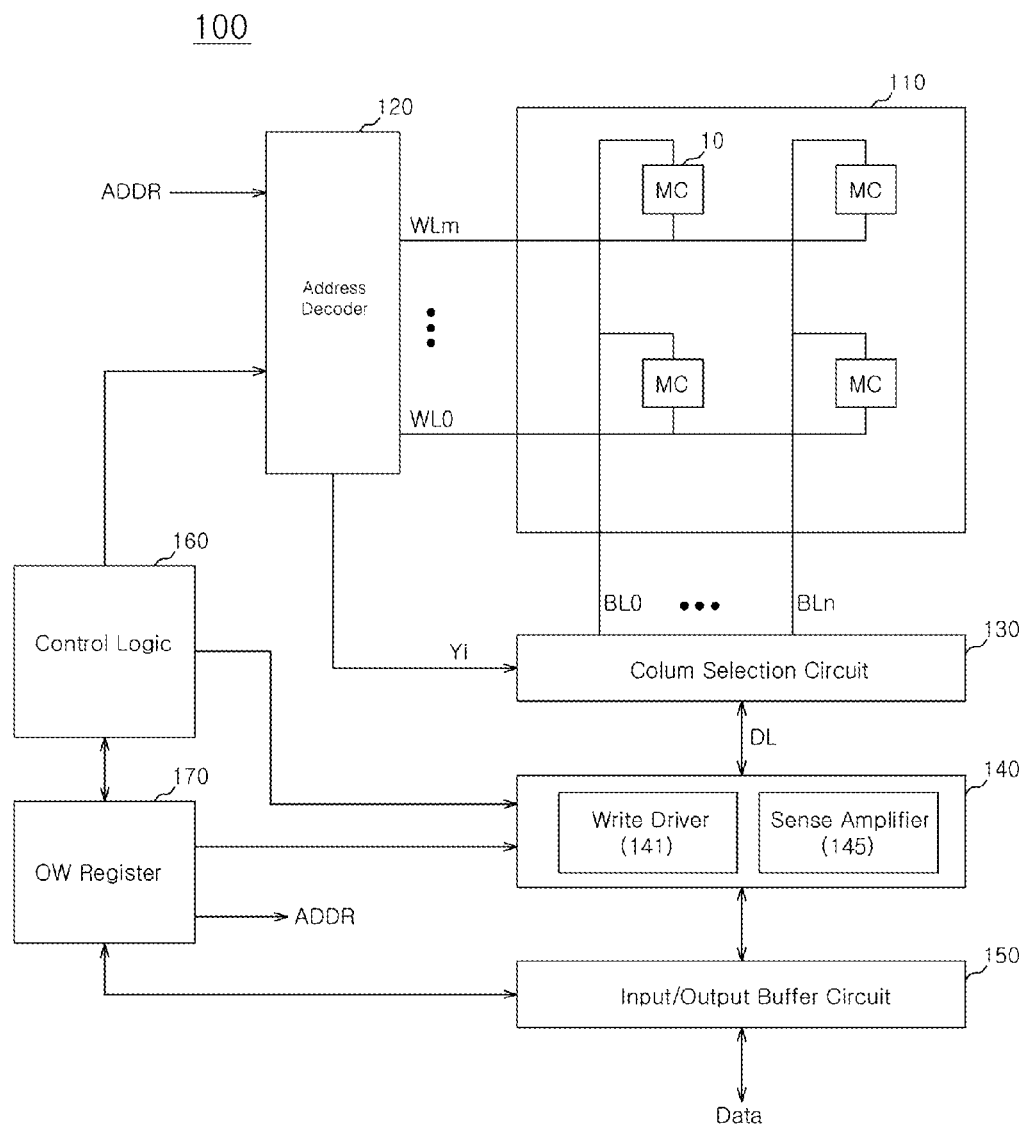
FIG. 1 is a block diagram illustrating an example of a variable resistance memory device according to an embodiment.

Hereinafter, various embodiments will be described below with reference to the accompanying drawings. However, the various embodiments are not limited to the embodiments to be described herein, but may be embodied into other forms. The embodiments are provided to generally describe the present invention such that the concept of the present invention may be easily understood by those skilled in the art.

In the drawings, the embodiments are not limited to illustrated specific forms, but are exaggerated for clarity. In this specification, specific terms are used to describe the present invention, but do not limit the scope of the present invention.

In this specification, terms such as and/or include any item among combinations of a plurality of related items or the plurality of related items. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise", "comprising", "have" and/or "having", when used herein, specify the presence of stated features, integers, steps, operations, elements, and/or components, but do not preclude the presence or addition of one or more other features, integers, steps, operations, elements, components, and/or groups thereof.

FIG. 1 is a block diagram illustrating an example of a variable resistance memory device according to an embodiment. The variable resistance memory device 100 will be described below by taking a phase change memory device using a phase change, that is, a resistance change, according to a temperature change as an example.

Referring to FIG. 1, the phase change memory device 100 may include a memory cell array 110, an address decoder 120, a column selection circuit 130, a data read/write circuit 140, an input/output buffer circuit 150, control logic 160, and an overlay window (OW) register 170.

The memory cell array 110 may include a plurality of memory cells MC 10 arranged in respective areas where bit lines BL0~BLn cross word lines WL0~WLm. Each of the memory cells MC may be formed of a phase change memory cell. For example, each memory cell MC can be formed of a phase change memory cell, including a memory element and a selecting element.

The memory cell MC may have a different resistance value depending on the program state of phase change materials (that is, GST materials) that form the memory element. The program state may be divided into the amorphous state having high resistance and the crystalline state having low resistance. The amorphous state may be defined as a reset state, and the crystalline state may be defined as a set state. The meaning that the memory cell MC has the amorphous state may mean that data "1" may have been programmed into the memory cell MC, and the meaning that the memory cell MC has the crystalline state may mean that data "0" may have been programmed into the memory cell MC. This memory cell MC will be described in below with reference to FIGS. 2 to 4.

The memory cell MC may have a plurality of intermediate states between the amorphous state and the crystalline state. This memory cell MC may be called a multi-level cell (MLC). The MLC may store data of 2 bits or more.

The address decoder 120 may be operated under the control of the control logic 160. The address decoder 120 may be connected to the memory cell array 110 through the word lines WL0~WLm. The address decoder 120 may be configured to decode an external input address ADDR. The address decoder 120 may provide bias voltage to a selected word line according to a result of decoding. The address decoder 120 may generate a column selection signal Yi for selecting a bit line according to a result of decoding. The generated column selection signal Yi may be provided to the column selection circuit 130.

The column selection circuit 130 may be connected to the memory cell array 110 through the bit lines BL0~BLn. The column selection circuit 130 may be configured to select a bit line in response to the column selection signal Yi (i=0~n) generated from the address decoder 120. The column selection circuit 130 may be configured to electrically connect a selected bit line and a data line DL in response to the column selection signal Yi.

The data read/write circuit 140 may be operated under the control of the control logic 160. The data read/write circuit 140 may include a write driver 141 and a sense amplifier 145.

The write driver 141 may be configured to provide a program current to the bit line BL through the data line DL in response to a write driver control signal, for example, a write driver activation signal. The write driver activation signal may be generated from the control logic 160. The write driver 141 may provide a reset current or a set current in response to the write driver activation signal. The reset current may be an electric current for making the GST materials of a selected memory cell in the reset state. That is, the reset current is an electric current for programming data "1" into a selected memory cell. The set current may be an electric current for making the GST materials of a selected memory cell in the set state. That is, the set current may be an electric current for programming data "0" into a selected memory cell.

The sense amplifier 145 may be configured to read out data stored in a selected memory cell in response to a sense amplifier control signal when a read operation or verify read operation is performed. The sense amplifier control signal may be generated from the control logic 160. The sense amplifier 145 may detect a difference between voltage of the data line DL and a reference voltage and may perform a read operation based on the detected difference.

The input/output buffer circuit 150 may be configured to receive data from an external device (for example, a memory controller, a memory I/F, and a host device etc.) or output data to the external device.

The control logic 160 may be configured to control an overall operation of the phase change memory device 100 in response to a command provided from the external device. For example, the control logic 160 will control the read, program (or write), and erase operations of the phase change memory device 100. The erase operation may mean an operation of programming a memory cell so that the memory cell may have the amorphous state.

The control logic 160 may be configured to decode a program command provided from the external device and to generate a command flag according to a result of the decoding. The command flag may be the control signal of the control logic 160 that indicates a program operation mode. In accordance with an embodiment, the command flag may be used as the write driver activation signal. The control logic 160 may provide the command flag to the write driver 141 when a program operation is performed.

The OW register 170 may be configured to temporarily store commands, addresses, and data provided from the external device. The OW register 170 may be configured to provide the temporarily stored commands, addresses, and data to the control logic 160, the address decoder 120, and the write driver 141 under the control of the control logic 160.

Figure 2:
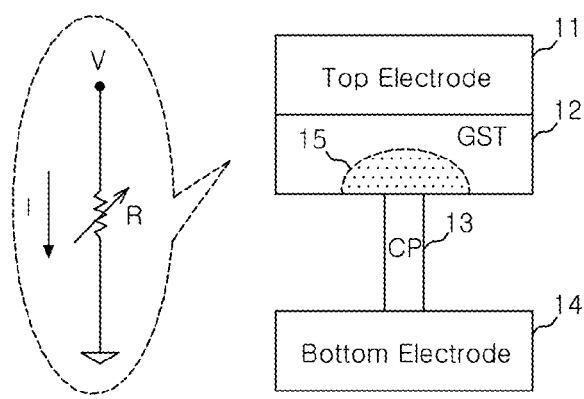
FIG. 2 is a diagram illustrating an example of the memory element of a memory cell shown in FIG. 1.

FIG. 2 is a diagram illustrating an example of the memory element of the memory cell shown in FIG. 1. The memory cell of the variable resistance memory device (see 100 of FIG. 1) may include the memory element and the selecting element. A schematic diagram of the memory element of the memory cell is illustrated in FIG. 2.

The memory element 16 may have a variable resistance value depending on the supplied current I. For this reason, the memory element 16 may also be called a resistance element. A cross section of the memory element 16 is described below. The memory element 16 may include a top electrode 11, GST materials 12, a contact plug (CP) 13, and a bottom electrode 14.

The top electrode 11 may be connected to the bit line BL. The bottom electrode 14 may be connected generally between the CP 13 and the selecting element (not shown). The CP 13 may be made of conductive materials (for example, TiN). The CP 13 may also be called a heater plug. The GST materials 12 may be formed generally between the top electrode 11 and the CP 13.

A phase of the GST materials 12 may be used to change the amount of supplied current and the time that it takes to supply the current. A phase of the GST materials 12 corresponding to the reset state or set state may be determined by an amorphous volume 15 as illustrated. The amorphous volume 15 may be reduced from the amorphous state toward the crystalline state. The amorphous state may correspond to the reset state, and the crystalline state may correspond to the set state. The GST materials 12 may have a variable resistance value depending on the amorphous volume 15. That is, written data may be determined by the amorphous volume 15 of the GST materials 12 that may be formed depending on a supplied current.

Figure 3:
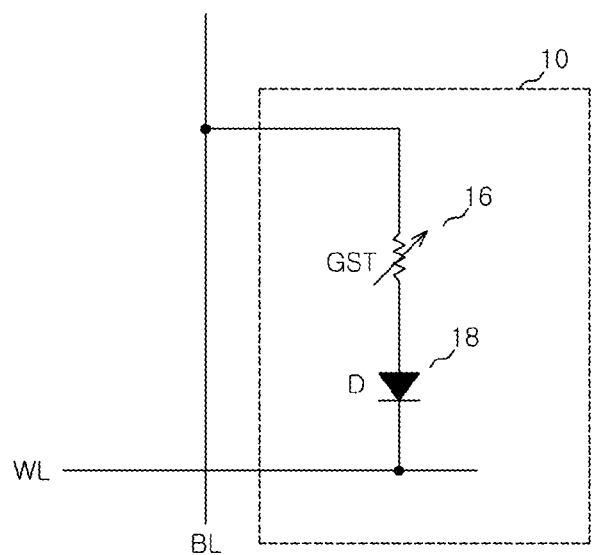
FIG. 3 is a circuit diagram of the memory cell shown in FIG. 1.

FIG. 3 is an example of a circuit diagram of the memory cell shown in FIG. 1. FIG. 3 illustrates a variable resistance memory cell including a diode switch type selecting element.

Referring to FIG. 3, the memory cell 10 may include a memory element 16 and a selecting element 18. The memory element 16 may be connected between the bit line BL and the selecting element 18. The selecting element 18 may be connected between the memory element 16 and the word line WL.

The memory element 16 may have substantially the same or the same configuration as the memory element illustrated in FIG. 2 and may perform the same operation as the memory element illustrated in FIG. 2, and thus a description thereof will be omitted.

The selecting element 18 may be formed of a diode D. The memory element 16 may be connected to the anode of the diode D, and the word line WL may be connected to the cathode of the diode D. When a ground voltage GND is supplied to the word line WL in order to select the memory cell 10, a voltage difference between the anode and the cathode of the diode D may be changed. When a voltage difference between the anode and the cathode of the diode D is greater than a threshold voltage of the diode D, the diode D may be turned on. When the diode D is turned on, an electric current may be supplied to the memory element 16 through the bit line BL. The supplied current may flow into the word line WL through the memory element 16, that is, the memory cell 10.

Figure 4:
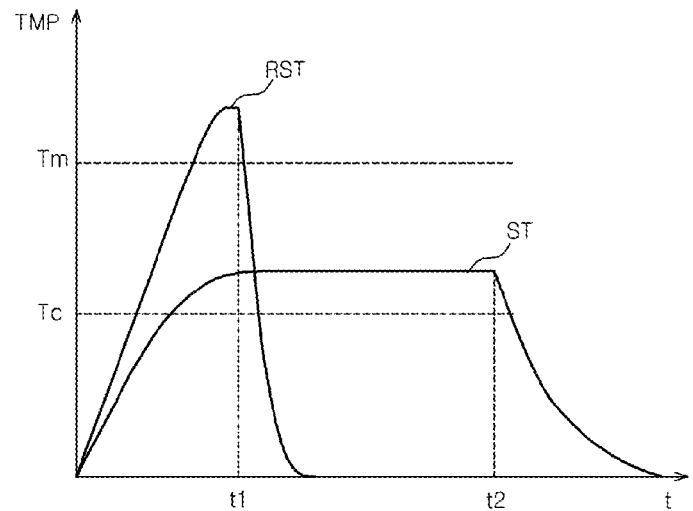
FIG. 4 is a graph explaining the characteristics of GST materials shown in FIG. 3.

FIG. 4 is a graph illustrating the characteristics of the GST materials shown in FIG. 3 (i.e., t may be for time and TMP may be for temperature). In FIG. 4, reference numeral 'RST' may indicate a condition wherein the phase of the GST materials becomes an amorphous state (that is, the reset state). Furthermore, reference numeral 'ST' may indicate a condition wherein the phase of the GST materials becomes the crystalline state (that is, the set state).

When the GST materials are heated to a higher temperature than the melting temperature Tm during a time t1 and then rapidly quenched, a phase of the GST materials may change into the amorphous state. When a phase of the GST materials changes into the amorphous state, the memory cell (see 10 of FIG. 1) may store data "1". In contrast, when the GST materials are heated to a higher temperature than a crystallization temperature Tc during a time t2 longer than the time t1 and then slowly quenched, a phase of the GST materials may change into the crystalline state. Here, the crystallization temperature Tc is lower than the melting temperature Tm. When a phase of the GST materials changes into the crystalline state, the memory cell 10 may store data "0".

Figure 5:
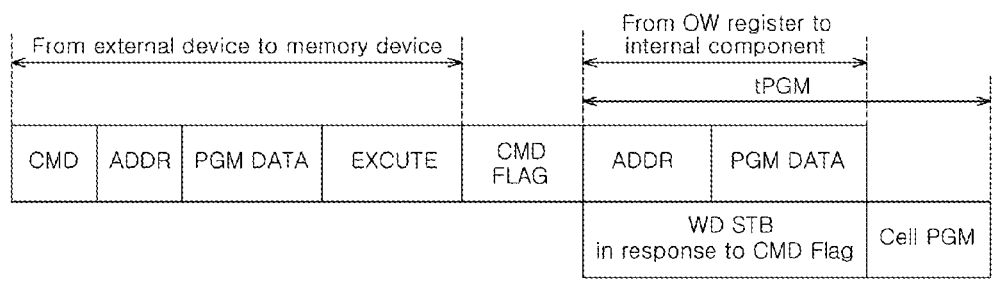
FIG. 5 is a timing diagram illustrating an example of a program operation of the variable resistance memory device according to an embodiment.

FIG. 5 is a timing diagram illustrating an example of a program operation of the variable resistance memory device 10 according to an embodiment. Furthermore, FIG. 6 is a table illustrating the command flag according to an embodiment. The program operation of the variable resistance memory device 100 according to the embodiment of the present invention will be described below with reference to FIGS. 1, 5, and 6.

The variable resistance memory device 100, that is, the phase change memory device 100 may perform a relevant operation in response to a command provided from an external device (for example, a memory controller, a memory I/F, or a host device etc.). For example, the phase change memory device 100 may perform a program operation in response to a program (or write) command CMD and an execution command EXCUTE provided from the external device. Here, the execution command EXCUTE may be a kind of confirmation command for indicating the execution of the provided program (or write) command CMD. It may be easily understood that program data PGM DATA and the address ADDR of a memory cell into which the program data PGM DATA may be programmed can be provided between the program command CMD and the execution command EXCUTE.

The program command CMD, the address ADDR, and the program data PGM DATA provided from the external device can be temporarily stored in the OW register 170 of the phase change memory device 100 until a program operation is completed. That is, the OW register 170 can buffer the program command CMD, the address ADDR, and the program data PGM DATA.

After the execution command EXCUTE is provided, the control logic 160 may decode the provided program command CMD through the OW register 170. The control logic 160 may generate the command flag CMD FLAG according to a result of the decoding. As described above, the command flag CMD FLAG may be the control signal of the control logic 160 for indicating the program operation mode.

Referring to FIG. 6, the command flag CMD FLAG may indicate fives types of program operation modes. That is, the command flag CMD FLAG may indicate an erase mode, a single program mode, a buffer program mode, a single overwrite program mode, and a buffer overwrite program mode. It may be easily understood that the command flag CMD FLAG can include data having a plurality of bits in order to distinguish the modes from each other.

The erase mode may be defined as a mode in which data (for example, data "1") meaning an erase state is programmed into a selected memory cell. That is, the erase mode may mean a mode in which data meaning an erase state is programmed into a selected memory cell at once(or simultaneously or collectively).

The single program mode may be defined as a mode in which data "0" only is programmed into a selected memory cell. For example, it may be assumed that data to be programmed into selected memory cells include a mixture of data "1" and data "0". If the selected memory cells are in an erased state, that is, data "1" has been programmed into the selected memory cells, program data "1" needs not to be redundantly programmed into the selected memory cells. Accordingly, only the remaining data (for example, data "0") other than data (for example, data "1") meaning the erase state, from among provided program data PGM DATA, may be programmed according to the single program mode.

The buffer program mode may be the same as the single program mode in that data (for example, data "1") meaning the erase state is not programmed into a selected memory cell, but only the remaining data (for example, data "0") is programmed into a selected memory cell. In addition, the buffer program mode may be defined as a mode in which data may be sequentially programmed into a selected memory cell from the start address to the end address of a provided address ADDR.

The single overwrite program mode may be defined as a mode in which provided program data may be programmed irrespective of data stored in a selected memory cell. That is, the single overwrite program mode may mean a mode in which provided program data may be programmed in an overwriting manner based on the provided program data.

The buffer overwrite program mode may be the same as the single overwrite program mode in that data may be programmed in an overwriting manner irrespective of data stored in a selected memory cell. In addition, the buffer overwrite program mode may be defined as a mode in which data may be sequentially programmed from the start address to the end address of a provided address ADDR.

Referring back to FIG. 5, the command flag CMD FLAG may be generated before the address ADDR and the program data PGM DATA temporarily stored in the OW register 170 are transferred to internal elements. The control logic 160 may provide the generated command flag CMD FLAG to the write driver 141. The write driver 141 may start to prepare to perform a program operation in response to the command flag CMD FLAG. That is, the write driver 141 may be activated and stabilized in response to the command flag CMD FLAG (i.e., WD STB in response to CMD Flag).

The write driver 141 may be activated while the address ADDR and the program data PGM DATA temporarily stored in the OW register 180 are transferred to a relevant element. Consequently, a program time tPGM, including the time that it takes to prepare for and stabilize a program current to be supplied to a memory cell (that is, the time that it takes to prepare for and stabilize the program operation of the write driver 141) and the time that a state of the memory cell is taken to be changed by the program current, can be reduced.

Figure 7:
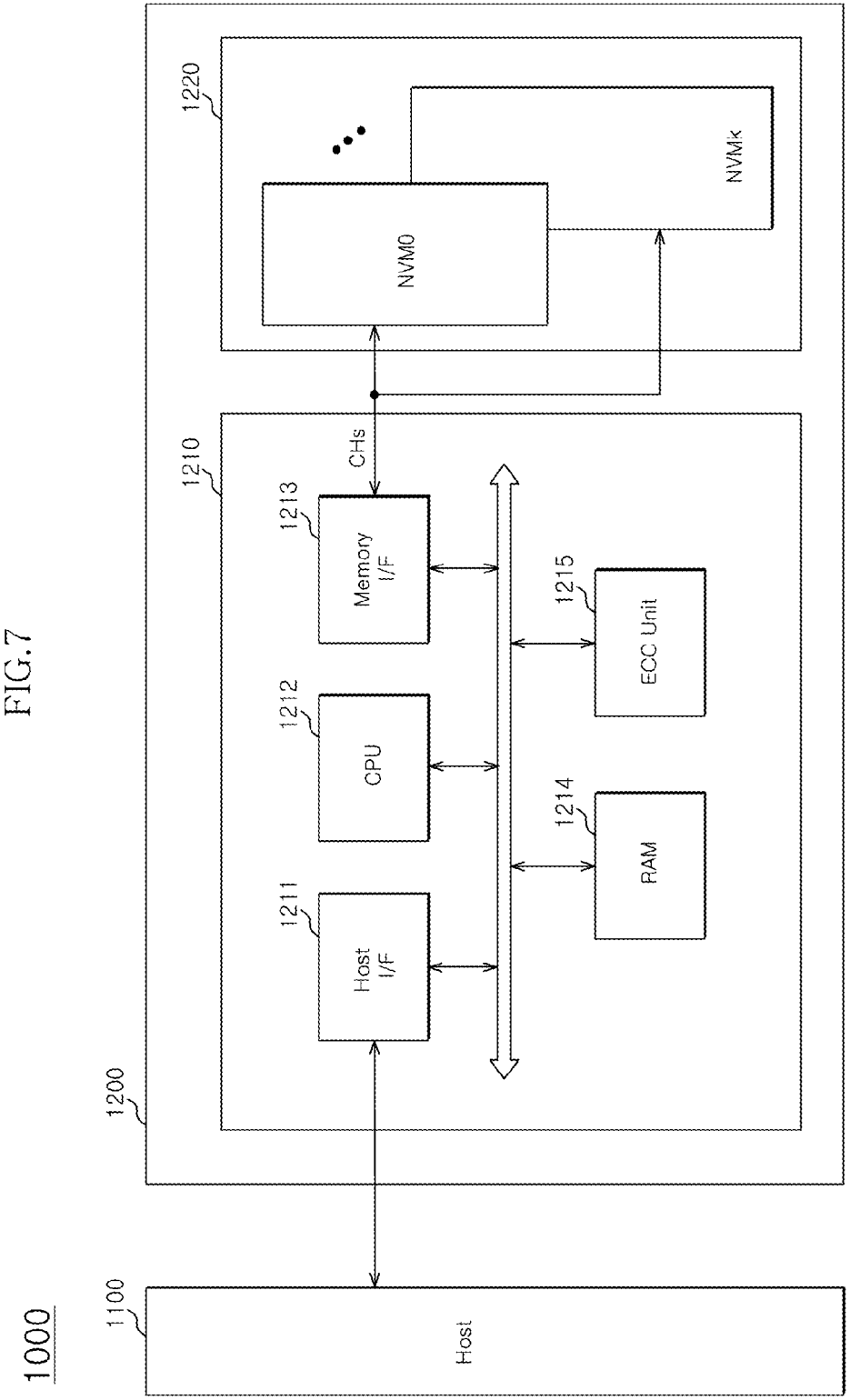
FIG. 7 is a block diagram illustrating an example of a data processing system including the variable resistance memory device according to an embodiment.

FIG. 7 is a block diagram illustrating a data processing system 1000 including the variable resistance memory device according to an embodiment. Referring to FIG. 7, the data processing system 1000 may include a host device 1100 and a data storage device 1200. The data storage device 1200 may include a controller 1210 and a data storage medium 1220. The data storage device 1200 can be connected to the host device 1100, such as a desktop computer, a notebook, a digital camera, a mobile phone, an MP3 player, and a game machine, and a like. The data storage device 1200 may also be called a memory system.

The controller 1210 may be connected to the host device 1100 and the data storage medium 1220. The controller 1210 may be configured to access the data storage medium 1220 in response to a request from the host device 1100. For example, the controller 1210 may be configured to control a read, program, or erase operation on the data storage medium 1220. The controller 1210 may be configured to drive firmware for controlling the data storage medium 1220.

The controller 1210 may include well-known elements, such as a host interface (I/F) 1211, a central processing unit (CPU) 1212, a memory interface (I/F) 1213, random access memory (RAM) 1214, and an error correction code (ECC) unit 1215.

The CPU 1212 may be configured to control an overall operation of the controller 1210 in response to a request from the host device 1100. The RAM 1214 can be used as the working memory of the CPU 1212. The RAM 1214 can buffer data read from the data storage medium 1220 or data provided from the host device 1100.

The host I/F 1211 may be configured to interface the controller 1210 with the host device 1100. For example, the host I/F 1211 can be configured to communicate with the host device 1100 through one of various interface protocols, such as a universal serial bus (USB) protocol, a multimedia card (MMC) protocol, a peripheral component interconnection (PCI) protocol, a PCI-express (PCI-E) protocol, a parallel advanced technology attachment (PATA) protocol, a serial ATA (SATA) protocol, a small computer system interface (SCSI) protocol, and an integrated drive electronics (IDE) protocol, etc.

The memory I/F 1213 may be configured to interface the controller 1210 with the data storage medium 1220 (i.e., CHs). The memory I/F 1213 may be configured to provide commands and addresses to the data storage medium 1220. Furthermore, the memory I/F 1213 may be configured to exchange data with the data storage medium 1220.

The data storage medium 1220 can be formed of the variable resistance memory device (see 100 of FIG. 1) according to an embodiment. The data storage medium 1220 can include a plurality of variable resistance memory devices NVM0~NVMk. When the data storage medium 1220 is formed of the variable resistance memory device 100 according to the embodiment of the present invention, the program speed of the data storage device 1200 can be improved.

The ECC unit 1215 may be configured to detect an error in data read out from the data storage medium 1220. Furthermore, the ECC unit 1215 may be configured to correct a detected error when the detected error falls within a correction range. Meanwhile, the ECC unit 1215 can be provided inside or outside the controller 1210 depending on the memory system 1200.

The controller 1210 and the data storage medium 1220 can be formed of a solid state drive (hereinafter referred to as an SSD).

As an example, the controller 1210 and the data storage medium 1220 can be integrated into one semiconductor device, thus forming a memory card. For example, the controller 1210 and the data storage medium 1220 can be integrated into one semiconductor device, thus forming a personal computer memory card international association (PCMCIA) card, a compact flash (CF) card, a smart media card, a memory stick, a multimedia card (MMC, RS-MMC, or MMC-micro), a secure digital (SD) card (SD, Mini-SD, or Micro-SD), or a universal flash storage (UFS), etc.

As another example, the controller 1210 or the data storage medium 1220 can be packaged and mounted in various forms. For example, the controller 1210 or the data storage medium 1220 can be packaged and mounted in manners, such as a package on package (POP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline IC (SOIC), a shrink small outline package (SSOP), a thin small outline package (TSOP), a thin quad flat package (TQFP), a system in package (SIP), a multi-chip package (MCP), a wafer-level fabricated package (WFP), and a wafer-level processed stack package (WSP), etc.

Figure 8:
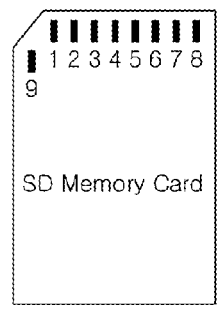
FIG. 8 is a diagram illustrating an example of a memory card including the variable resistance memory device according to an embodiment.

///FIG. 8 is a diagram illustrating a memory card including the variable resistance memory device according to an embodiment. FIG. 8 illustrates an outward form of a secure digital (SD) card, from among memory cards.

Referring to FIG. 8, the SD card may include one command pin (for example, a pin No. 2), one clock pin (for example, a pin No. 5), four data pins (for example, pin Nos. 1, 7, 8, and 9), and three power supply pins (for example, pin Nos. 3, 4, and 6).

A command and a response signal may be transferred through the command pin (that is, pin No. 2). In general, a command may be transmitted from the host device to the SD card, and the response signal may be transmitted from the SD card to the host device.

The data pins (that is, pin Nos. 1, 7, 8, and 9) may be divided into reception (Rx) pins for receiving data from the host device and transmission (Tx) pins for sending data to the host device. Each of the Rx pins and each of the Tx pins form a pair in order to send a differential signal.

The SD card may include the variable resistance memory device (see 100 of FIG. 1) according to the embodiment of the present invention and a controller for controlling the variable resistance memory device. The controller included in the SD card can have the same construction and functions as the controller 1210 illustrated in FIG. 7.

Figure 9:
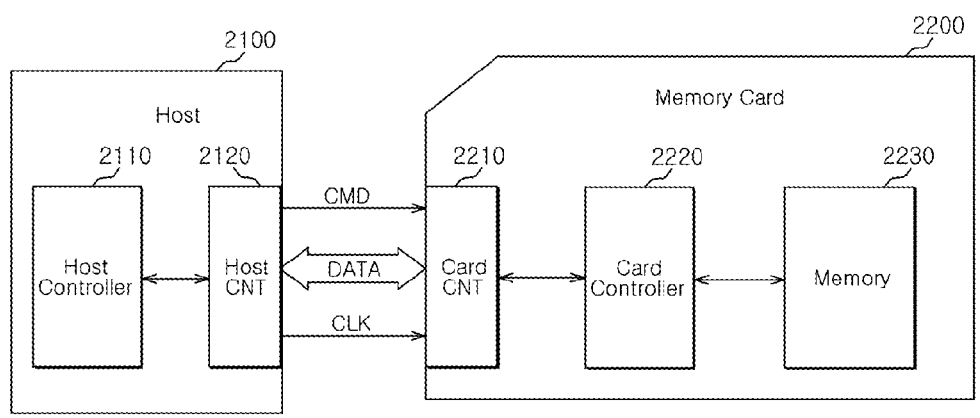
FIG. 9 is a block diagram illustrating an example of a connection relation between the internal elements of the memory card shown in FIG. 8 and a host.

FIG. 9 is a block diagram illustrating a connection relation between the internal elements of the memory card shown in FIG. 8 and a host device. Referring to FIG. 9, the data processing system 2000 may include a host device 2100 and a memory card 2200. The host device 2100 may include a host controller 2110 and a host access unit (CNT) 2120. The memory card 2200 may include a card access unit (CNT) 2210, a card controller 2220, and a memory device 2230.

The host CNT 2120 and the card CNT 2210 may include a plurality of pins. The pins may include a command pin, a clock pin, a data pin, and a power supply pin. The number of pins may vary depending on the type of memory card 2200.

The host device 2100 may store data in the memory card 2200 and may read out data stored in the memory card 2200.

The host controller 2110 may send a write command CMD, a clock signal CLK generated from a clock generator (not shown) within the host device 2100, and data DATA to the memory card 2200 through the host CNT 2120. The card controller 2220 may be operated in response to the write command CMD received through the card CNT 2210. The card controller 2220 may store data DATA, received using a clock signal generated from a clock generator (not shown) within the card controller 2220, in the memory device 2230 in response to the received clock signal CLK.

The host controller 2110 may send the read command CMD and the clock signal CLK generated from the clock generator (not shown) within the host device 2100 to the memory card 2200 through the host CNT 2120. The card controller 2220 may be operated in response to a read command received through the card CNT 2210. The card controller 2220 may read data from the memory device 2230 by using the clock signal generated from the clock generator (not shown) within the card controller 2220 in response to the received clock signal CLK and may send the read data to the host controller 2110.

Figure 10:
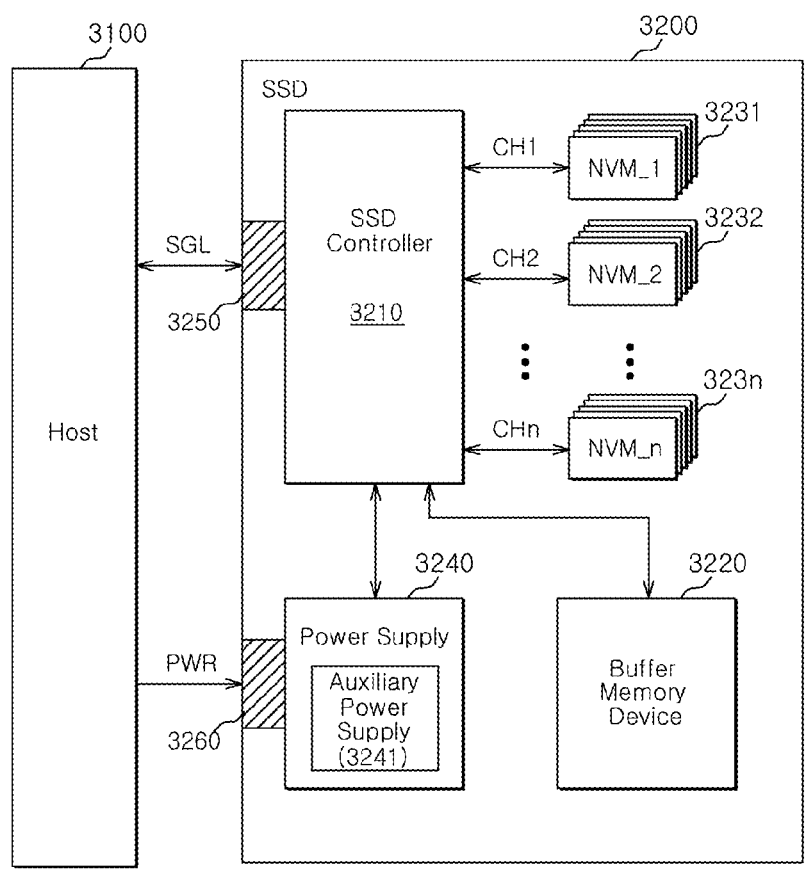
FIG. 10 is a block diagram illustrating an example of a SSD including the variable resistance memory device according to an embodiment.

FIG. 10 is a block diagram illustrating an example of an SSD including the variable resistance memory device according to an embodiment. Referring to FIG. 10, a data processing system 3000 may include a host device 3100 and an SSD 3200.

The SSD 3200 may include an SSD controller 3210, a buffer memory device 3220, variable resistance memory devices 3231~323n, a power supply 3240, a signal connector 3250, and a power connector 3260.

The SSD 3200 may be operated in response to a request from the host device 3100. That is, the SSD controller 3210 may be configured to access the variable resistance memory devices 3231~323n in response to a request from the host device 3100. For example, the SSD controller 3210 may be configured to control the read, program, and erase operations of the variable resistance memory devices 3231~323n.

The buffer memory device 3220 may be configured to buffer data to be stored in the variable resistance memory devices 3231~323n. Furthermore, the buffer memory device 3220 may be configured to buffer data read out from the variable resistance memory devices 3231~323n. The data buffered in the buffer memory device 3220 may be transmitted to the host device 3100 or the variable resistance memory devices 3231~323n under the control of the SSD controller 3210.

The variable resistance memory devices 3231~323n may be used as the storage media of the SSD 3200. Each of the variable resistance memory devices 3231~323n can be formed of the variable resistance memory device (see 100 of FIG. 1) according to an embodiment. Accordingly, the program speed of the SSD 3200 can be improved.

The variable resistance memory devices 3231~323n may be connected to the SSD controller 3210 through respective channels CH1~CHn. In various embodiments, one or more of the variable resistance memory devices can be connected to one channel. The variable resistance memory devices connected to one channel may be connected to the same signal bus and the same data bus.

The power supply 3240 may be configured to supply the SSD 3200 with a power supply PWR received through the power connector 3260. The power supply 3240 may include an auxiliary power supply 3241. The auxiliary power supply 3241 may be configured to supply the power supply PWR so that the SSD 3200 is normally finished when the power is suddenly turned off. The auxiliary power supply 3241 may include super capacitors capable of charging the power supply PWR.

The SSD controller 3210 may exchange signals SGL with the host device 3100 through the signal connector 3250. Here, the signals SGL can include a command, an address, and data. The signal connector 3250 can be formed of a connector, such as parallel advanced technology attachment (PATA), serial advanced technology attachment (SATA), a small computer system interface (SCSI), or a serial SCSI (SAS), depending on the method of interfacing used by the host device 3100 and the SSD 3200 used between each other.

Figure 11:
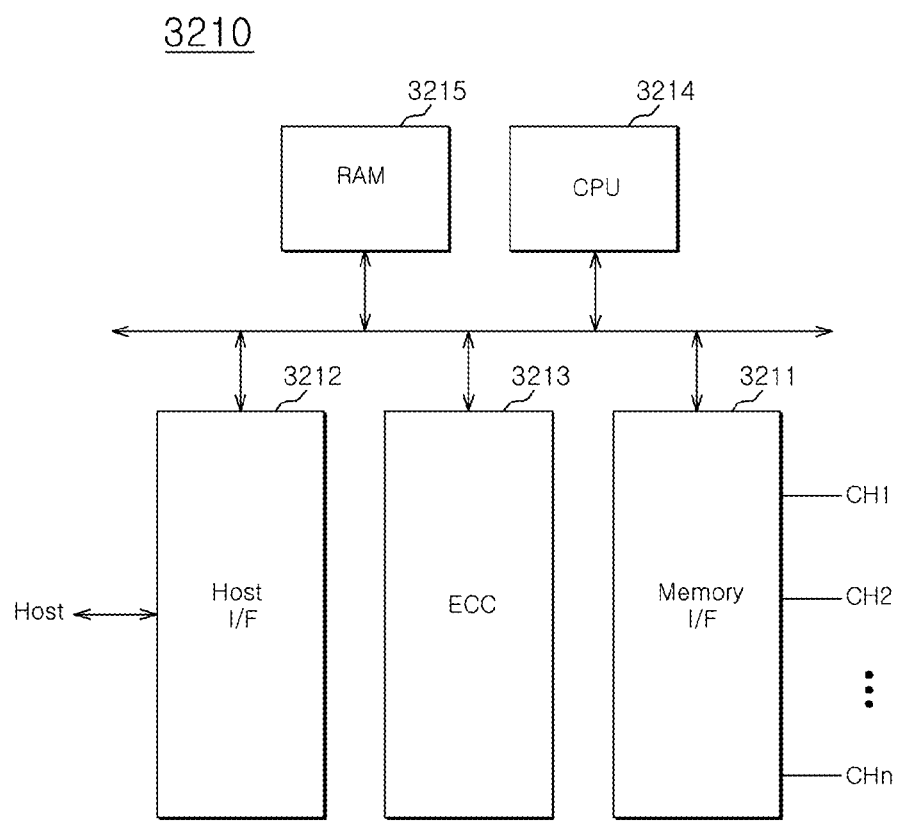
FIG. 11 is a block diagram illustrating an SSD controller illustrated in FIG. 10.

FIG. 11 is a block diagram illustrating the SSD controller 3210 illustrated in FIG. 10. Referring to FIG. 11, the SSD controller 3210 may include a memory I/F 3211, a host I/F 3212, an ECC unit 3213, a CPU 3214, and RAM 3215.

The memory I/F 3211 may be configured to provide commands and addresses to the variable resistance memory devices 3231~323n. Furthermore, the memory I/F 3211 is configured to exchange data with the variable resistance memory devices 3231~323n. The memory I/F 3211 can scatter data, received from the buffer memory device 3220, to the channels CH1~CHn under the control of the CPU 3214. Furthermore, the memory I/F 3211 may transfer data, read output from the variable resistance memory devices 3231~323n, to the buffer memory device 3220 under the control of the CPU 3214.

The host I/F 3212 may be configured to interface the SSD 3200 with the host device 3100 in response to the protocol of the host device 3100. For example, the host I/F 3212 can be configured to communicate with the host device 3100 through one of parallel advanced technology attachment (PATA), serial advanced technology attachment (SATA), a small computer small interface (SCSI), and a serial SCSI (SAS), etc. Furthermore, the host I/F 3212 can perform a disk emulation function of supporting the host device 3100 so that the host device 3100 recognizes the SSD 3200 as a hard disk drive (HDD).

The ECC unit 3213 may be configured to generate parity bits based on data received from the variable resistance memory devices 3231~323n. The generated parity bits can be stored in the spare areas of the variable resistance memory devices 3231~323n. The ECC unit 3213 may be configured to detect an error in data read out from the variable resistance memory devices 3231~323n. The ECC unit 3213 may be configured to correct a detected error if, for example, the detected error falls within a correction range.

The CPU 3214 may be configured to analyze and process the signals SGL received from the host device 3100. The CPU 3214 may control an overall operation of the SSD controller 3210 in response to a request from the host device 3100. The CPU 3214 may control the operations of the buffer memory device 3220 and the variable resistance memory devices 3231~323n according to firmware for driving the SSD 3200. The RAM 3215 may be used as a working memory device for driving the firmware.

Figure 12:
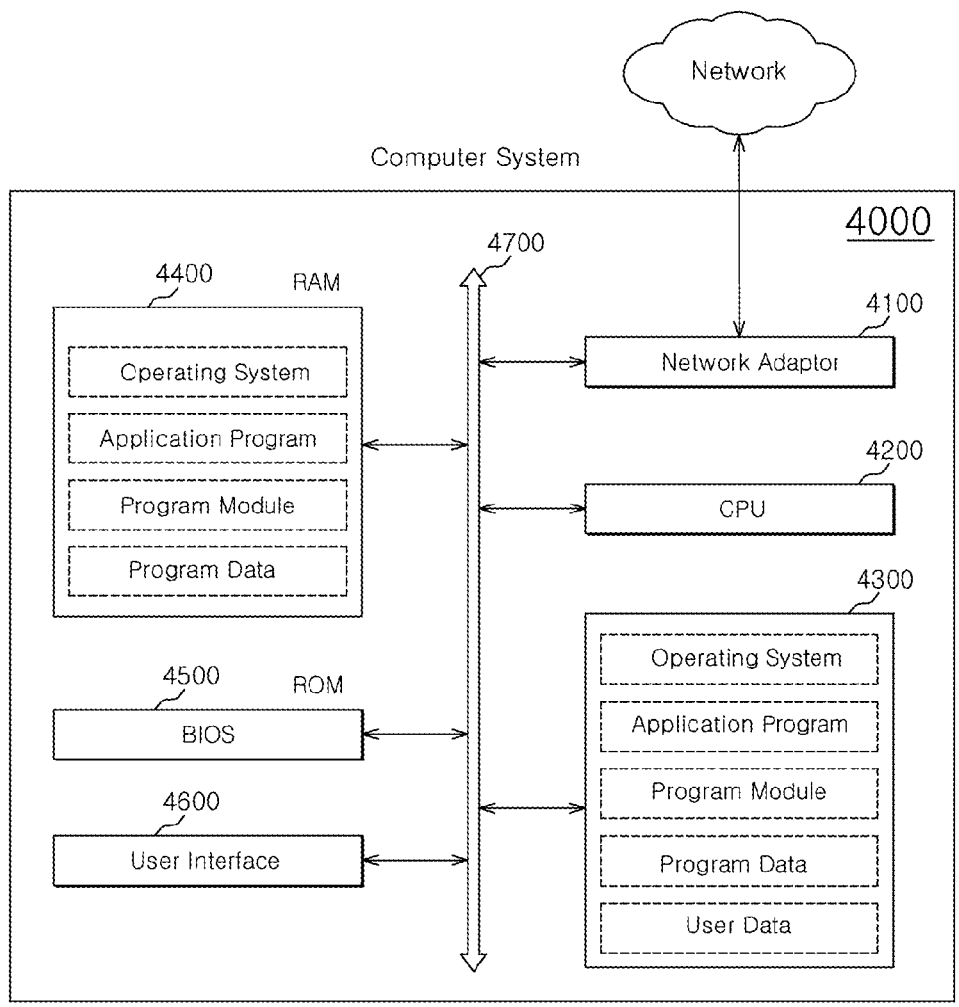
FIG. 12 is a block diagram illustrating an example of a computer system on which a data storage device including a mounted variable resistance memory device according to an embodiment.

FIG. 12 is a block diagram illustrating a computer system on which a data storage device including the variable resistance memory device may be mounted according to an embodiment. Referring to FIG. 12, the computer system 4000 may include a network adaptor 4100, a CPU 4200, a data storage device 4300, RAM 4400, ROM 4500, and a user interface 4600 which may be electrically connected to a system bus 4700. Here, the data storage device 4300 can be the data storage device 1200 shown in FIG. 7 or the SSD 3200 shown in FIG. 10.

The network adaptor 4100 may provide an interface between the computer system 4000 and external networks. The CPU 4200 may perform overall operation processing for driving an operating system or program programs residing in the RAM 4400.

The data storage device 4300 may store overall data necessary for the computer system 4000. For example, an operating system for driving the computer system 4000, application programs, various program modules, program data, and user data may be stored in the data storage device 4300.

The RAM 4400 can be used as the working memory device of the computer system 4000. When the computer system 4000 is booted, program data necessary to drive the operating system, the application programs, the various program modules, and programs read from the data storage device 4300 may be loaded on the RAM 4400. A Basic Input/Output System (BIOS), that is, a basic input/output system, which may be activated before the operating system may be driven and may be stored in the ROM 4500. Pieces of information may be exchanged between the computer system 2000 and a user through the user interface 4600.

It will be easily understood that the computer system 4000 can further include devices, such as a battery, application chipsets, and a camera image processor (CIS), although not shown.

In accordance with the embodiments of the present invention, the time that the variable resistance memory device takes to perform a program can be reduced.

While certain embodiments have been described above, it will be understood to those skilled in the art that the embodiments described are by way of example only. Accordingly, the variable resistance memory device and the data storage device including the same described herein should not be limited to the described embodiments. Rather, the variable resistance memory device and the data storage device including the same described herein should only be limited in light of the claims that follow when taken in conjunction with the above description and accompanying drawings.

What is claimed is:

1. A variable resistance memory device, comprising:
   memory cells arranged at a region where word lines and bit lines cross each other;
   control logic configured to generate a command flag indicative of a program operation mode in response to a program command provided from an external device and configured to control a program operation of the memory cells based on the command flag; and
   a write driver configured to be activated in response to the flag command and configured to supply a program current to the memory cells.

2. The variable resistance memory device according to claim 1, further comprising a register configured to temporarily store the program command, an address for selecting the memory cells, and data to be programmed into the memory cells.

3. The variable resistance memory device according to claim 2, wherein the control logic generates the command flag generally while the address is stored in the register is decoded and provides the generated command flag to the write driver.

4. The variable resistance memory device according to claim 1, wherein the control logic performs any one of an erase operation, a single program operation, a buffer program operation, a single overwrite program operation, and a buffer overwrite program operation based on the command flag.

5. The variable resistance memory device according to claim 4, wherein data of an erase state is programmed in all the memory cells through the erase operation.

6. The variable resistance memory device according to claim 4, wherein remaining data other than data of an erase state, from among data provided from the external device, is programmed into the memory cells through the single program operation.

7. The variable resistance memory device according to claim 4, wherein remaining data other than data of an erase state, from among data provided from the external device, is sequentially programmed into the memory cells from a start address to an end address of the memory cells through the buffer program operation.

8. The variable resistance memory device according to claim 4, wherein data provided from the external device is programmed into the memory cells through the single overwrite program operation.

9. The variable resistance memory device according to claim 4, wherein data provided from the external device is sequentially programmed into the memory cells from a start address to an end address of the memory cells through the buffer overwrite program operation.

10. The variable resistance memory device according to claim 1, wherein each of the memory cells comprises:
   a memory element configured to have one end connected to the bit line and made of phase change materials; and
   a selecting element configured to select the memory element.

11. The variable resistance memory device according to claim 10, wherein the selecting element comprises a diode connected between an other end of the memory element and the word line.

12. A data storage device, comprising:
   a variable resistance memory device; and
   a controller configured to control the variable resistance memory device,
   wherein the variable resistance memory device comprises:
   memory cells arranged at a region where word lines and bit lines cross each other;
   control logic configured to generate a command flag indicative of a program operation mode in response to a program command provided from the controller and configured to control a program operation of the memory cells based on the command flag; and
   a write driver configured to be activated in response to the flag command and configured to supply a program current to the memory cells.

13. The data storage device according to claim 12, wherein the variable resistance memory device further comprises a register configured to temporarily store the program command, an address for selecting the memory cells, and data to be programmed into the memory cells.

14. The data storage device according to claim 13, wherein the control logic generates the command flag generally while the address is stored in the register is decoded and provides the generated command flag to the write driver.

15. The data storage device according to claim 12, wherein the control logic performs any one of an erase operation, a single program operation, a buffer program operation, a single overwrite program operation, and a buffer overwrite program operation based on the command flag.

16. The data storage device according to claim 12, wherein each of the memory cells comprises:
   a memory element configured to have one end connected to the bit line and made of phase change materials; and
   a selecting element configured to select the memory element.

17. The data storage device according to claim 16, wherein the selecting element comprises a diode connected between an other end of the memory element and the word line.

18. The data storage device according to claim 16, wherein the phase change materials comprise a mixture of germanium, antimony, and tellurium.

19. The data storage device according to claim 12, wherein the variable resistance memory device and the controller are formed of a memory card.

20. The data storage device according to claim 12, wherein the variable resistance memory device and the controller are formed of a solid state drive.

* * * * *